United States Patent [19]

Morach et al.

[11] Patent Number: 5,002,648

[45] Date of Patent: Mar. 26, 1991

[54] PROCESS FOR PRODUCING AN INORGANIC THIN FILM ON A SUBSTRATE USING A TARGET

[75] Inventors: Eugen Morach, Liederbach; Marcellus Peuckert, Hofheim am Tanus; Günter Schmidt, Niedernhausen; Hans-Peter Schölch, Erlangen-Frauenaurach, all of Fed. Rep. of Germany

[73] Assignee: Hoechst Aktiengesellschaft, Frankfurt am Main, Fed. Rep. of Germany

[21] Appl. No.: 398,090

[22] Filed: Aug. 24, 1989

[30] Foreign Application Priority Data

Aug. 26, 1988 [DE] Fed. Rep. of Germany ....... 3828925
Nov. 25, 1988 [DE] Fed. Rep. of Germany ....... 3839745

[51] Int. Cl.$^5$ .......................... C23C 14/34; B05D 1/00
[52] U.S. Cl. .......................... 204/192.15; 204/192.24; 505/731; 427/34
[58] Field of Search .................. 204/192.15, 192.24; 505/1, 730, 731, 732, 816, 819, 739; 427/34

[56] References Cited

PUBLICATIONS

Qiao et al., "An EM Study . . . Techniques", High Temp. Superconductors II, Extended Abstracts, Apr. 5-9, 1988.
Sawkawa et al., "Superconductivity . . . Spraying", Jap. Journal of Applied Physics, vol. 27, No. 6, 6/1988 pp. 1083–1085.
Konaka et al., "Preparation of . . . Spraying", Jap. Journal of Applied Physics, vol. 27, No. 6, 6/1988 pp. 1092–1093.
Lishi et al., "Plasma Sprayed High Tc Superconductor", Proceedings of the Adriatica Res. Conf. 7/1987.
Fraser et al., "Time Dependent . . . YBa$_2$Cu$_3$O$_{7-\delta}$", High Temp. Superconductors II, Extended Abs., Apr. 1987.
Nakao et al., "Magnetron . . . above 80K", Jap. Journal of Applied Physics, vol. 27, No. 3, 3/1988, pp. 378–380.
Sullivan et al., "BiSrCaCu Oxide . . . sputtering", Appl. Phys. Lett. 52(23), 6 Jun. 1988.

Primary Examiner—Nam X. Nguyen
Attorney, Agent, or Firm—Curtis, Morris & Safford

[57] ABSTRACT

An inorganic thin film is deposited on a substrate by sputtering a sputter target by cathode sputtering in the vicinity of the substrate. To produce the target, at least two pulverulent starting components are mixed. The mixture is tempered if a uniform reaction product can be obtained in this process. It is powdered and the powder is deposited on a metallic base by plasma-jet spraying. This produces the target. Preferably, an oxide mixture is tempered which is a starting product for a superconducting ceramic material. In order to convert the thin film deposited to a superconducting state, it is treated for a prolonged time at temperatures of 300°–800° C. in an oxygen-containing atmosphere. The reaction product obtained on tempering may have, for example, the overall composition ZBa$_m$Cu$_n$O$_x$, where $1.5 \leq m \leq 2.5$, $2 \leq n \leq 5$ and $4 \leq x \leq 9$, Z standing for at least one of the elements Y, La, Nd, Sm, Eu, Gd, Dy, Ho, Er, Tm, Yb and Lu, or may have the overall compositions TlBa$_l$Ca$_m$Cu$_n$O$_x$ or BiSr$_l$Ca$_m$Cu$_n$O$_x$, where $0.3 \leq l \leq 3$, $0.3 \leq m \leq 3$, $0.3 \leq n \leq 3$ and $2 \leq x \leq 11$.

5 Claims, 3 Drawing Sheets

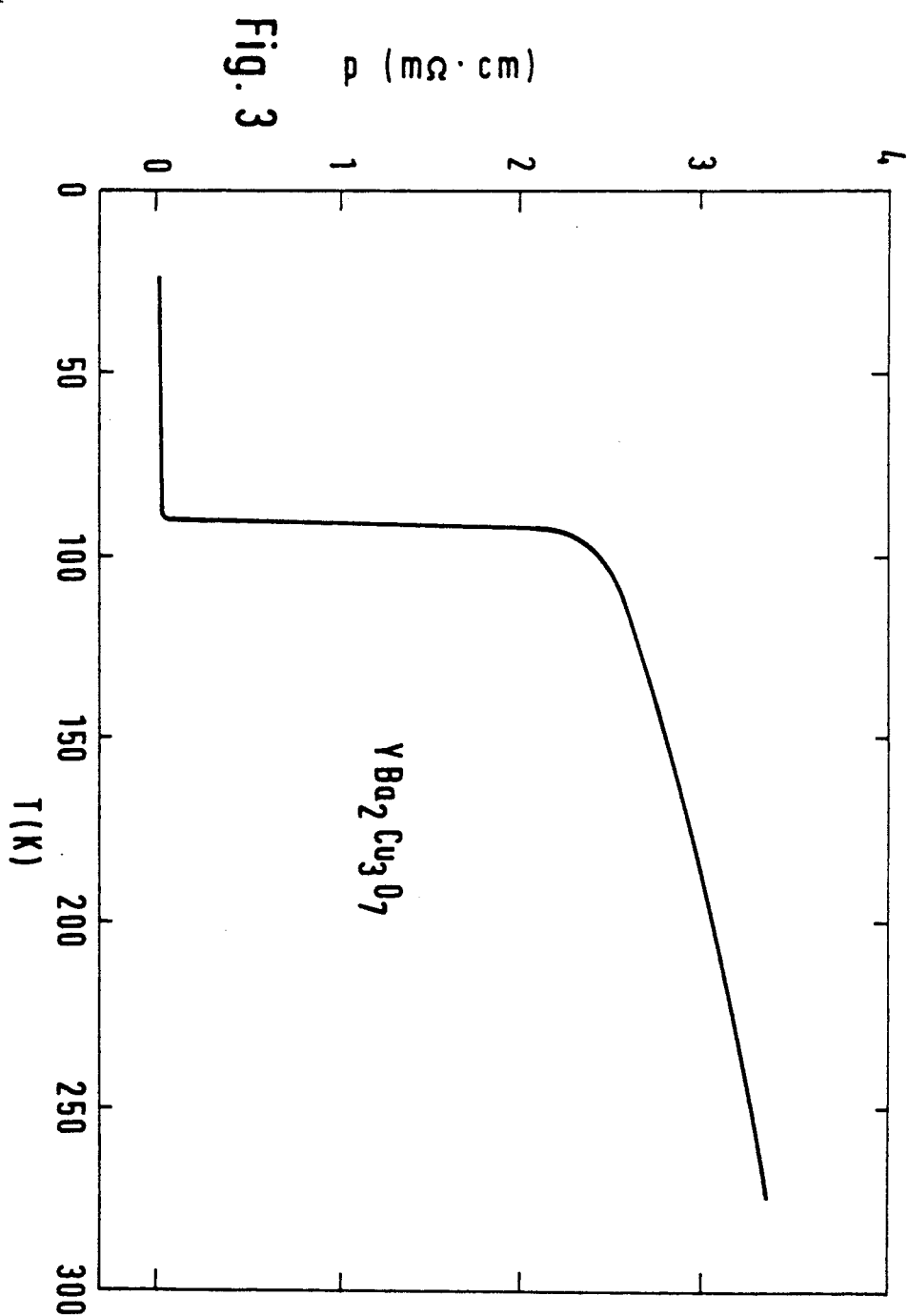

PROCESS FOR PRODUCING AN INORGANIC THIN FILM ON A SUBSTRATE USING A TARGET

The present invention relates to a process for producing a thin inorganic film on an electrically conducting or electrically insulating substrate, in which a sputtering target is sputtered by cathode sputtering in the vicinity of the substrate. The invention further relates to a process for producing the sputtering target used by thermal spraying processes.

The deposition of thin films by the sputtering method on substrates of metal, plastic or ceramic for use in the fields of microelectronics, data storage, optics and mechanics (reduction of friction and wear) is of great industrial importance. At the same time, films which are composed of two, three or more components are increasingly becoming of interest. Thus, for example, the new high-temperature superconducting materials hitherto known, in which the first applications will probably take place also in the form of thin films, are at least ternary to quaternary compounds. In order to deposit such multicomponent systems by the sputtering process, it is necessary to provide the corresponding sputtering targets (L.I. Maissel and R. Glang, Handbook of Thin Film Technology).

The versatility of the sputtering technique in relation to the materials which can be sputtered requires a large spectrum of different target materials. These include metals and metallic compounds, semiconducting and ceramic substances in the broadest sense, and also mixed targets of metallic and ceramic materials. A number of materials are fused in vacuum, the heat required being in general supplied by inductive heating, occasionally, however, also by an electron beam or by arcing. Many combinations of metals cannot, however, readily be alloyed since they exhibit miscibility gaps, at least at room temperature. A very high melting point of the material, considerably different vapor pressures of the components or the tendency to sublimation also make target production by fusion difficult. In these cases, in particular also in the case of ceramic material, the methods of powder metallurgy are selected. The mixed pulverulent starting materials are in that case compacted by hot pressing, isostatic pressing or cold compaction and subsequent sintering under pressure.

These processes have considerable disadvantages, in particular in the case of multicomponent systems. Targets produced by powder metallurgy are frequently very brittle and of inadequate mechanical strength, which results in difficulties in the subsequent processing. Furthermore, targets can be produced in this manner only in relatively small dimensions and special form. In addition it is difficult to homogeneously distribute the components and also to ensure uniform target properties over the entire area and depth. Since the powder-metallurgy production of targets is furthermore an expensive process, the user incurs considerable costs, in particular if numerous different compositions are to be tested. Further costs and problems, for example due to interdiffusion, arise in the necessary bonding of these materials to electrically conducting metallic bases or target support plates, which are typically of copper.

There was therefore the object of providing a process with which a sputtering target of a plurality of components could be produced, which target is suitable for producing thin films by cathode sputtering, and at the same time of avoiding the disadvantages besetting the methods of powder metallurgy.

The invention is based on the discovery that coatings in a thickness of about 0.1 to 3 mm can be produced by thermally spraying homogenized powder mixtures or homogeneous powders onto metallic plate-type oases (for example, of copper, iron or steel) and that these in turn, in combination with the base, are eminently suitable as targets for sputtering processes such as, for example, DC, RF, diode, magnetron or even reactive sputtering with additional gaseous components.

BRIEF DESCRIPTION OF THE DRAWINGS

FIG. 3 illustrates the dependence of the specific resistance ($\rho$) on the temperature (°K).

Figure 1:
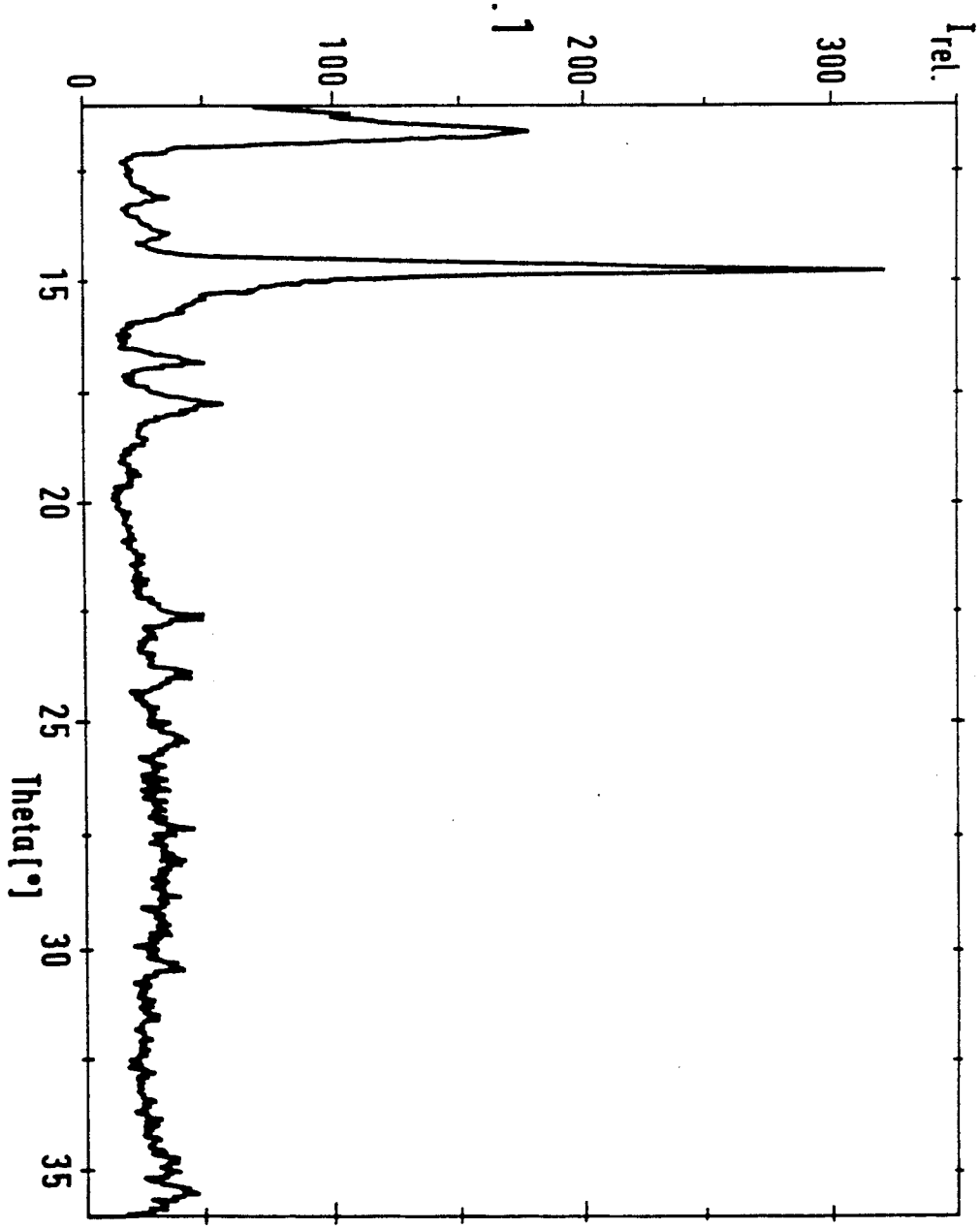
FIG. 1 depicts an X-ray diffraction pattern of a representative target.

A process has now been found for producing an inorganic thin film on a substrate by cathode sputtering of a sputtering target in the vicinity of the substrate. For the purpose of producing the target, this process comprises mixing at least two pulverulent inorganic starting components, tempering the pulverulent mixture if necessary and repulverizing it, and depositing the powder on an electrically conductive base by thermal spraying. The process of cathode sputtering is known to the person skilled in the art, for example, from L.I. Maissel and R. Glang, Handbook of Thin Film Technology. The distance target/base is mostly between 1 cm and 10 cm when sputtering. The thin film itself may be deposited on an electrically conducting or, alternatively, insulating substrate. The thickness of the sputtered thin film is in general between 0.05 and 10 $\mu$m. Suitable substrates for the production of thin films are single crystals or polycrystalline materials in laminar, thread-type or strip-type geometry. The substrates may be composed, for example, of metals, silicon or ceramic materials such as MgO, $SrTiO_3$, $Al_2O_3$, $LiNbO_3$ or $ZrO_2$.

Before thermal spraying, the mixture of the pulverulent inorganic starting components is preferably tempered (=heated for some time ) if a solid-state reaction occurs in this process until a uniform or virtually uniform reaction product is obtained at the same time. If that is not the case, for example in the case of a mixture of two high-melting metals, or if the reaction can be brought about only on sintering, the tempering is dispensed with.

The thermal spraying processes used are predominantly flame spraying and plasma-jet spraying with the variants cited in DIN 32 530 (Oct. 1987 draft). In flame spraying, the pulverulent spray additive (=coating substance) is generally incipiently fused or fused in a fuel gas/oxygen flame and propelled by the expanding combustion gas alone or with simultaneous support by a sputtering gas (for example, compressed air or the like) onto the material surface. In plasma-jet spraying, the pulverulent spraying additive is converted from the solid to the liquid phase inside or outside the spray gun by a plasma flame, accelerated and propelled onto the material surface.

The gases (for example, argon, helium, hydrogen, nitrogen or mixtures thereof) are converted to the plasma state in an electric arc of high power density which is struck between a tungsten cathode and a copper anode. An electrically neutral plasma jet leaves the anode, which is constructed as burner jet, at high temperature and velocity.

Suitable spray additives are either powder and powder mixtures or also powders prereacted by chemical reaction. It is also possible to use agglomerated powders or powders encased with a binder or an alloy constituent.

The particle size of the pulverulent spray additive is advantageously 1 to 250 μm, preferably 1 to 90 μm, in particular 5 to 45 μm. Inter alia, the required peak-to-valley height of the sprayed layer, which is approx. 70 μm without subsequent processing, is crucial for the choice of particle size. The peak-to-valley height can be reduced below 1 μm by subsequent processing, for example grinding.

All materials having good electrical and thermal conductivity, for example metals or carbon, are suitable as target base. Preferably, copper plates having a thickness of 1 to 3 mm are used. To improve the adhesion and simultaneously prevent sinter diffusion, an intermediate film of a metallic or ceramic material may be deposited between base and the film subsequently to be sputtered. The thickness of the sprayed-on layer which is subsequently to be sputtered is 0.1 to 3 mm.

It is an essential advantage of this process that the targets can be produced very simply and inexpensively. Targets of any size and shape, which may also be used for large-area coatings and also for sputtering thread-like or strip-like substrates, can be produced. For example, it is possible to produce a laminar target which reaches a dimension of at least 20 cm in at least one linear extension. This is not possible with the powder metallurgy processes standard in the prior art. The number of components can be freely chosen and is not upwardly limited. The process also functions with a single pure component. However, in that case hot pressing of the powder is more economical. The thermal spraying process also makes it possible to produce homogeneously mixed films of component combinations which are not uniform chemical compounds or homogeneous, thermodynamically stable mixtures or solutions. Targets which are composed of a base plate having coatings of metals, oxides, borides, fluorides, nitrides, carbides, silicides, phosphides, chalcogenides and other substance groups, can be produced by the process described.

The components of the spray coating are homogeneously distributed and the target properties are constant over the entire area and depth. Furthermore, in the case of targets which have been produced by thermal spraying, the bonding operation is unnecessary since these targets can be screwed directly onto the cathode.

Compared with substances which have been produced by ceramic means, thermally sprayed films have characteristic morphological features. Thus, the incident spray particles are joined to the substrate base predominantly by adhesion, mechanical anchorage, shrinkage forces and, in some cases, welding. The spray particles which are partially oxidized during the flight phase are deformed on impact and adapt to the roughness of the material surface. Subsequent particles build up pat-like to form a microporous film with oxide films and oxide inclusions situated inbetween. In contrast to sputtering targets produced by powder metallurgy, thermal spraying produces a laminar film structure typical of ceramic sprayed layers. Thermal spraying in a controlled gas atmosphere of Ar, $H_2$, $N_2$, $CH_4$, $SiH_4$, $O_2$, $F_2$ etc. results in metallic, nitridic, carbidic, silicidic, oxidic, fluoridic etc. sputtering targets.

Thermally sprayed targets are suitable for use in diode and magnetron sputtering systems. They can be used either in the HF (high-frequency) or, if the sprayed-on film is of adequate electrical conductivity, in the DC (direct-current) sputtering process. Using thermally sprayed targets it is specifically possible to produce superconducting thin films.

In particular, sputtering targets which correspond to, or approach, a superconducting ceramic material in their composition can also be produced by the process according to the invention. In this case, a product which corresponds in its composition to a superconductor except perhaps for the oxygen content or approaches this composition may first be obtained in a manner known per se from suitable pulverulent oxides or oxide precursors by a solid-state reaction. For example, a mixture of $Bi_2O_3$, SrO, CaO and $Cu_2O$ may have the gross composition $Bi_2Sr_2Ca_2Cu_3O_9$ whereas the corresponding supraconductor has a higher oxygen content and the formula $Bi_2Sr_2Ca_2Cu_3O_{10+x}$. The product of the solid-state reaction is powdered and then deposited by thermal spraying on an electrically conductive base. In the subsequent cathode sputtering of the target so obtained, the different volatility of the individual types of atom may result in a slight shift in the stoichiometry. It is therefore possible, and also advantageous, to increase the proportion, used in the target, of readily volatile components, for example of alkaline earths, somewhat compared with the intended composition.

In particular, thin films of the overall composition $ZBa_mCu_nO_x$, where Z stands for at least one of the elements Y, La, Nd, Sm, Eu, Gd, Dy, Ho, Er, Tm, Yb or Lu and where m is a number between 1.5 and 2.5, n is a number between 2 and 5 and x is a number between 4 and 9, can be obtained with the specified process by thermally spraying targets and by sputtering said targets. The production of films of the approximate composition $YBa_2Cu_3O_x$ by plasma-jet spraying has been described by R.A. Neiser et al. (Materials Science and Engineering 91 (1987), L13). The films so prepared were not, however, used as targets.

Targets (and coatings) of the overall composition $BiSr_lCa_mCu_nO_x$, where l, m and n are numbers between 0.3 and 3 and x is a number between 2 and 11, can also be produced by this process.

The thin films deposited by sputtering can be converted in a manner known per se into a superconducting ceramic material by increasing the oxygen content - symbolized by (x). This is done by prolonged tempering of the thin film in the range from 300° to 800° C. in an oxygen-containing atmosphere. The tempering should be conducted for at least 10 min, preferably at least 1 h. A long heating does no harm. The invention is explained in more detail by the examples.

EXAMPLE 1

A superconducting powder produced by solid-state reaction and having the composition $Bi_2Sr_1Ca_1Cu_1O_x$ is deposited by means of plasma-jet spraying in a thickness of 0.5 mm on a copper base having a thickness of 3 mm and a diameter of 75 mm. According to an energy dispersive X-ray analysis, the stoichiometry of the sprayed-on layer is $Bi_2Sr_{0.7}Ca_{0.8}Cu_{1.10}O_x$. This target is electrically insulating (R>30 MΩ, 1 cm measurement point spacing) in the state so produced and is suitable for use in the RF sputtering process. The coating of the target becomes conductive ($R \approx 200 \, \Omega - 1000 \, \Omega$) as a result of a suitable thermal post-treatment (10 minutes at 800° C. in flowing oxygen, followed by cooling in the furnace to 400°-500° C. in 1 hour, then quenching in air to room temperature) and it can consequently be used as DC sputtering cathode.

A film was deposited on $SrTiO_3$ (100) single crystal surfaces using this target in a magnetron sputtering system Z 400 (Leybold AG) in the RF mode at 13.56 MHz. For this purpose, the system was first evacuated to a basic pressure of less than $5 \times 10^{-4}$ Pa. The sputtering process itself was carried out in pure argon at a pressure of 0.8 Pa and a target/substrate spacing of 30 mm. The substrates are at room temperature. With a power of 250 W ($V=2.6$ kV, $I=0.1$ A), a target direct voltage of 100 V is established. The deposition rate is about $10^{-8}$ cm/s in the RF mode.

Figure 2:
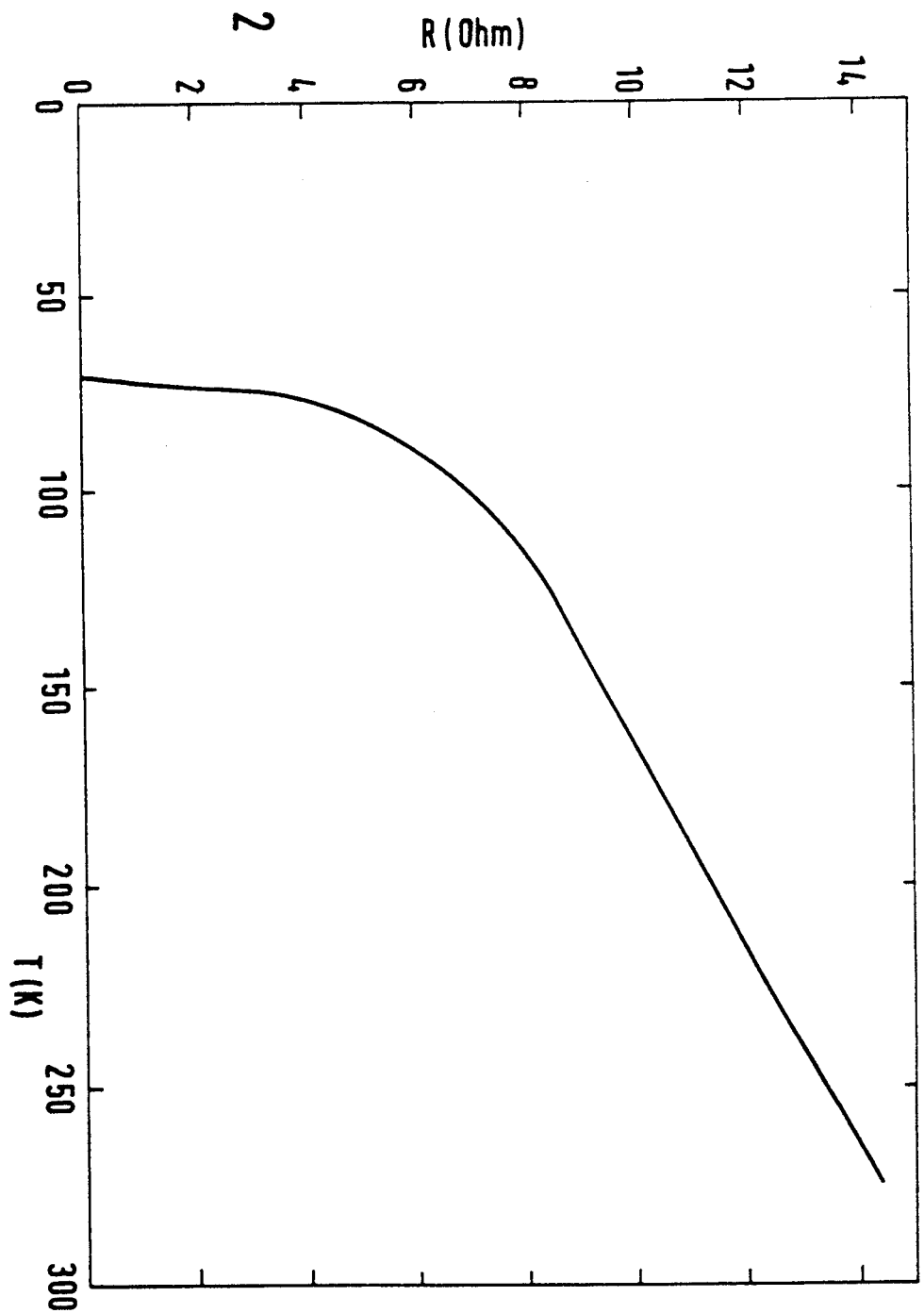
FIG. 2 illustrates the dependence of the resistance (R) on temperature (°K).

Untempered films are electrically insulating and exhibit an amorphous X-ray spectrum. After a thermal post-treatment (7 min at 820° C. in $O_2$ and subsequent quenching in air), the films are crystalline and superconducting with critical onset temperatures of 96K. FIG. 1 shows an X-ray diffraction pattern. The dependence of the resistance R on temperature emerges from FIG. 2.

EXAMPLE 2

A superconducting powder of the composition $YBa_2Cu_3O_x$ is sprayed in a thickness of 0.5 mm onto a copper base, as in Example 1. The layer has a Cu deficiency of 15% compared with the starting powder. After a thermal post-treatment (20 minutes at 950° C. in flowing $O_2$ and slow cooling to room temperature), the coating of the target is electrically conducting and it can be used as a DC sputtering cathode. Stoichiometric $YBa_2Cu_3O_x$ films were produced on $SrTiO_3$ (100) single crystal surfaces at a substrate temperature of 77K and 373K using this target in a magnetron sputtering system in the DC mode. The sputtering process was carried out in pure argon at a pressure of 1 Pa and a target/substrate spacing of 30 mm. A voltage of 200 V and a current of 100 mA produces a deposition rate of $10^{-8}$ cm/s.

Following a thermal post-treatment (5 minutes at 920° C. in flowing $O_2$, 12 hours at 450° C. and subsequent cooling to room temperature), the films exhibit metallic resistance behavior above $T_o$ and a critical temperature $T_o$ of 92K with a width $\Delta T_o$ of 2K. The dependence of the specific resistance $\rho$ on the temperature T emerges from FIG. 3.

I claim:

1. A process for producing a thin film on a substrate, said process comprising the steps of:
   (a) forming a powder by mixing at least two pulverulent starting components;
   (b) depositing said powder as a coating on an electrically conductive base by thermal spraying and thereby producing a target; and
   (c) sputtering said target by cathode sputtering in the vicinity of said substrate.

2. A process as claimed in claim 1, wherein said substrate is electrically conducting.

3. A process as claimed in claim 1, wherein said substrate is electrically insulating.

4. A process as recited in claim 1, wherein said coating on said electrically conductive base has a thickness of about 0.1 to 3 mm.

5. A process for producing a thin film on a substrate, said process comprising the steps of:
   (a) forming a powder by mixing at least two pulverulent starting components;
   (b) depositing said powder as a coating having a thickness of from 0.1 to 3 mm on an electrically conductive base by thermal spraying and thereby producing a target; and
   (c) sputtering said target by cathode sputtering in the vincinity of said substrate.

* * * * *